United States Patent [19]

Benander et al.

[11] Patent Number: 4,698,244

[45] Date of Patent: Oct. 6, 1987

[54] DEPOSITION OF TITANIUM ALUMINIDES

[75] Inventors: Robert E. Benander, Sylmar; Robert A. Holzl, LaCanada, both of Calif.

[73] Assignee: Air Products and Chemicals, Inc., Allentown, Pa.

[21] Appl. No.: 793,616

[22] Filed: Oct. 31, 1985

[51] Int. Cl.$^4$ ............................................. C23C 16/00
[52] U.S. Cl. ................................................... 427/253
[58] Field of Search ............ 427/213, 216, 217, 255.2, 427/253; 148/6.2, 6.3; 428/552, 650, 651, 654, 660, 66

[56] References Cited

U.S. PATENT DOCUMENTS

| | | | |
|---|---|---|---|
| 2,886,469 | 5/1959 | Fitzer et al. | 427/253 |
| 3,252,823 | 5/1966 | Jacobson et al. | 427/213 |
| 3,276,903 | 10/1966 | Galmiche | 427/253 |
| 3,415,672 | 12/1968 | Levenstein et al. | 427/250 |
| 3,464,843 | 9/1969 | Basche | 427/253 |
| 4,082,864 | 4/1978 | Kendall | 427/253 |
| 4,427,720 | 1/1984 | Gauje | 427/253 |

FOREIGN PATENT DOCUMENTS

| | | | |
|---|---|---|---|
| 141999 | 11/1947 | Australia | 427/253 |
| 2511396 | 2/1983 | France . | |
| 765793 | 1/1957 | United Kingdom | 427/253 |
| 798853 | 1/1958 | United Kingdom | 427/253 |

OTHER PUBLICATIONS

Chem. Abs., Vol. 98, No. 22, May 1983.

Primary Examiner—John D. Smith
Assistant Examiner—Janyce A. Bell
Attorney, Agent, or Firm—Richard A. Dannells; James C. Simmons, Jr.; E. Eugene Innis

[57] ABSTRACT

The invention relates to an method of producing a titanium aluminide coating on a substrate by producing a flow of hydrogen and gaseous aluminum monochloride over a titanium surface to react to form a gaseous flow of titanium trichloride and aluminum monochloride and contacting the substrate with the flow of titanium trichloride and aluminum monochloride at a temperature of 800° to 1200° C., said substrate being a temperature below the temperature of the gases.

6 Claims, 1 Drawing Figure

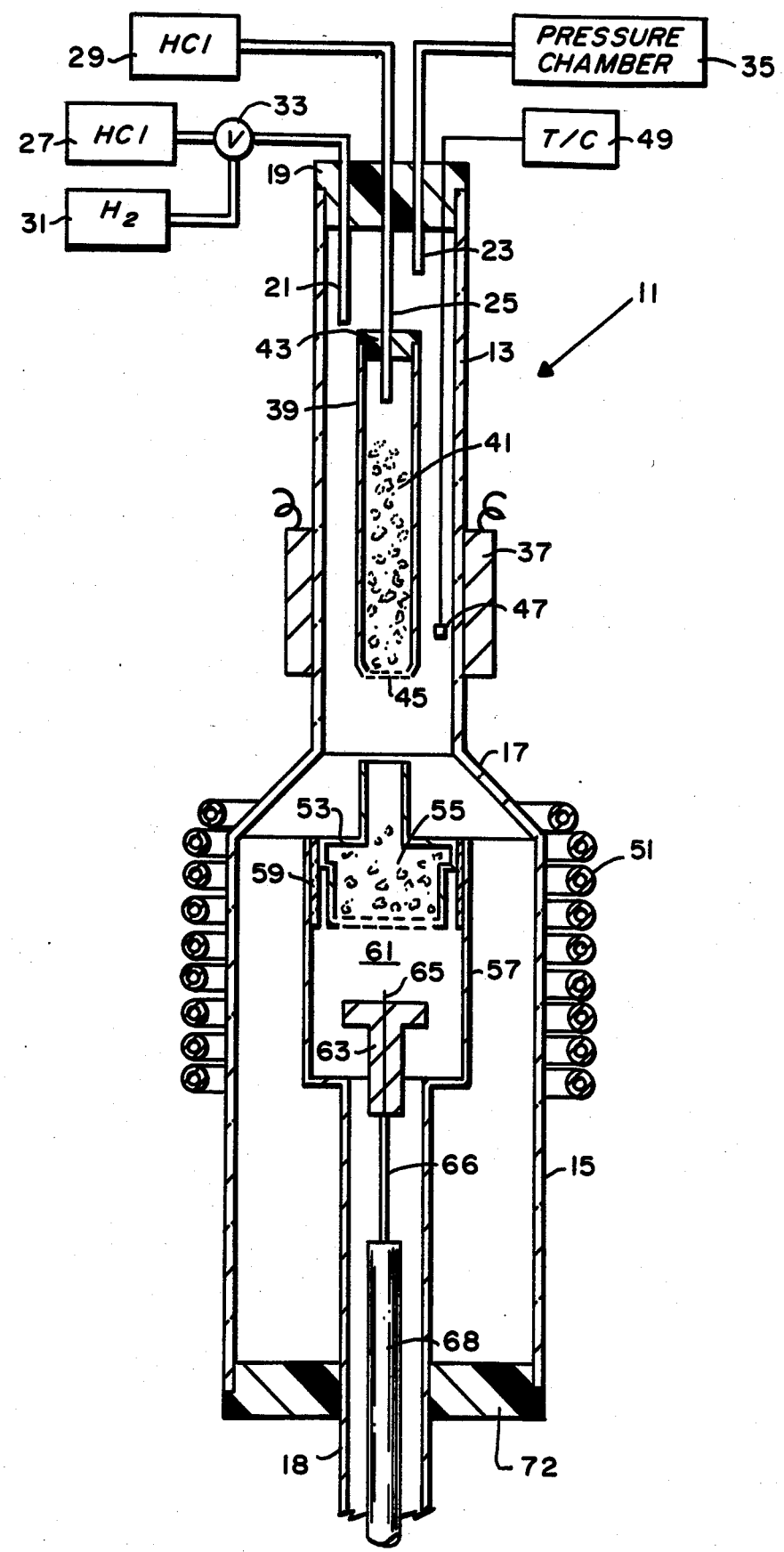

DEPOSITION OF TITANIUM ALUMINIDES

This invention relates generally to the production of titanium alloys containing titanium and aluminum. More particularly, the invention relates to an improved method for producing a titanium aluminide coating on a substrate surface, and to a coated article produced in accordance with such a method.

Numerous titanium aluminides have been reported in the prior art. Titanium aluminide structures of particular interest for composite structures are titanium aluminide intermetallic compounds having atomic ratios of titanium to aluminum between about one and three. These materials are of interest because of their high temperature mechanical properties and their chemical inertness combined with low density. They are considered as potentially important for use as barrier layers for ceramic fiber composites with metal matrix. They are potentially interesting as well as erosion resistant coatings or oxidation resistant coatings for moderately high temperature duty in engine parts.

For example, certain turbine or aircraft engine parts comprised of composite structures of carbon or carbide fibers and a metal matrix may exhibit good high temperature behavior when the fibers are provided with titanium aluminide coatings. Such structures typically are constructed by first forming an interlaced skeleton of carbon fibers and subsequently impregnating the fiber skeleton with a matrix material such as a metal, a metal alloy, or a suitable resin. The nature and manufacture of such composite structures are well known in the art and will not be detailed further herein.

In the principal area of interest, namely using such coatings in metal matrix composites, a typical application would be the coating of a fiberous skeleton of silicon carbide with selected titanium aluminides to prevent degradation of the fibers by interaction with the matrix material during process or use.

In order to produce graphite fiber skeletons wherein the fibers are coated with titanium aluminides, chemical vapor deposition has been proposed. The well known throwing power of the chemical vapor deposition process suggests that the ceramic fiber skeleton could be easily infiltrated with the coating gases to produce a uniform non-permeable thin coating on the fibers.

Although the advantages of the CVD process are evident, chemical vapor deposition has not, prior to this invention, been successfully employed to provide such barrier coatings. Although it is thermochemically possible to reduce volatile precursors of aluminum and titanium to the respective metals, impractically high temperatures are required. Since the free energy of formation of titanium aluminide is substantially less than the free energy of the precursor gases, such as aluminum trichloride and titanium tetrachloride, the energy balance is so unfavorable that the classical CVD reaction does not proceed.

It is an object of the present invention to provide an improved method for producing a titanium aluminide coating on a substrate surface.

Another object of the invention is to provide a method for the chemical vapor deposition of titanium and aluminum on a substrate at relatively low temperatures.

Another object of the invention is to provide a coated article having an improved titanium aluminide coating.

Other objects of the invention will become apparent to those skilled in the art from the following description, taken in connection with the accompanying drawing wherein the sole figure is a schematic cross-sectional view of a chemical vapor deposition reactor system which may be employed to practice the method of the invention.

Very generally, the method of the invention produces a titanium aluminide coating on a substrate surface. The substrate is supported in a reactor chamber and gaseous aluminum monochloride and titanium trichloride are passed over the surface of the substrate at gas temperatures of between about 800° C. and about 1200° C. The substrate surface is maintained at a temperature below the temperature of the gases sufficient to cause disproportionation of the gases to simultaneously deposit titanium and aluminum on the substrate.

The resultant coatings are characterized by titanium and aluminum in an atomic ratio of titanium to aluminum of between about one and three. The deposits have a substantially columnar grain structure oriented substantially perpendicular to the surface of the substrate, with the grains thereof being between about $50\mu$ and $90\mu$ in the elongate dimension and between about $10\mu$ and $30\mu$ in the transverse dimension.

Referring now more particularly to the figure, the cross-sectional schematic diagram therein depicts a chemical vapor deposition reactor for use in practicing the method of the invention. The reactor includes an outer quartz envelope 11 having an upper section 13 and a larger diameter lower section 15. The upper and lower sections are joined by a frusto-conical section 17. Gas flows are introduced to the reactor at the upper end of the section 13 through a suitable stopper 19 of a material capable of holding up to the operating temperatures in the reactor environment. Gases are evacuated through a conduit 18 in the lower end of the larger diameter section 15 by suitable evacuation means, not illustrated, well known to those skilled in the art.

Three gas conduit tubes 21, 23, and 25, pass through the stopper 19 into the upper section 13 of the quartz tube 11. The tube 21 is connected to a source 27 of hydrogen chloride gas. A second source 29 of hydrogen chloride gas is connected to the tube 25. A source 31 of hydrogen is also connected to the tube 21 through a mixer valve 33. Pressure within the reactor is controlled through the tube 23, which is connected to a pressure regulation chamber 35.

A clamshell type heater 37 (a resistance heater having two semicylindrical sections to clamp around the envelope) surrounds the upper section 13 of the quartz envelope 11 approximately three quarters of the way down the section 13. Inside the section 13, a basket or pot 39 is suitably suspended by means, not shown, and contains a particulate bed 41 of aluminum. The bed of aluminum, such as aluminum chips, provides a surface area through which hydrogen chloride gas is passed via the tube 25, which extends downwardly through a stopper 43 and into the basket 39. The lower end of the basket 39 is provided with a porous diaphragm 45 to retain the aluminum chips but to permit gas to exit from the pot 39. Temperature of the bed 41 is maintained by the clamshell heater 37 in accordance with the temperature sensed by a temperature sensor 47 positioned between the pot and the heater and connected to a suitable temperature controller 49.

The upper part of the lower tube 15 is surrounded by an induction heating coil 51. A heating pot 53 is suitably supported, by means not shown, within the coil 51 and contains particulate titanium in the form of titanium chips 55. The titanium chips provide a titanium "surface" over which reactant gases are passed as described below. The pot 55 is separated from the cylindrical wall 57 of a reaction chamber 61 by an annular insulating sleeve 59. The reaction chamber 61, defined by the wall 57, contains a part holder 63 in which the part 65 to be coated is held. The configuration of the part holder may be of any type suited to the particular substrate being coated, and is therefore not described further in detail. The part holder illustrated is supported on a carbon rod 66 which is rotated by a suitable mechanism 68. The lower end of the section 15 is closed by a stopper 72. Thermocouples, not shown, are provided for detecting the temperature within the pot 53 and on the surface of the part 65. Suitable alternative heating methods may be employed rather than the clamshell heater 37 or the induction heater 51.

In utilizing the apparatus illustrated to practice the method of the invention, aluminum trichloride is generated by passing hydrogen chloride at elevated temperatures but below the melting point of aluminum through the bed 41 of aluminum particles. The hydrogen chloride passed through the bed 41 emanates from the source 29 via the tube 25 as $AlCl_3$. The reaction is as follows:

$$3HCl + Al \rightarrow AlCl_3 + 3/2 H_2.$$

The aluminum trichloride passes out of the lower end of the pot 39 through the porous opening 45 and enters the upper end of the reaction chamber 61. At the same time, a flow of hydrogen chloride is established in the upper tube 13 which bypasses the pot 39 and enters the upper end of the reaction chamber 61. Before passing into the reaction chamber 61, both the aluminum trichloride gas and the hydrogen chloride gas leaving the upper tube 13 pass through the particulate bed 55 of titanium chips contained in the pot 53. The resultant reaction is as follows:

$$HCl + AlCl_3 + Ti \rightarrow TiCl_3 + AlCl + \tfrac{1}{2} H_2.$$

As a result of the foregoing reaction, a flow of gaseous aluminum monochloride and a flow of gaseous titanium trichloride emanates from the lower end of the pot 53. These gases are maintained at a temperature of between about 800° C. and about 1200° C. by suitably heating the titanium chips in the pot 53 by means of the induction heater 51. The temperature of the surface of the part being coated is maintained at a lower temperature than the gases. This is done by heating the part holder in any suitable way, and monitoring part temperature by suitable means, such as a thermocouple, not shown. As a consequence, two disproportionation reactions take place, followed by combination reactions which result in a co-deposition of titanium and aluminum on the surface of the part 65. These reactions are as follows:

$$3AlCl \rightarrow AlCl_3 + 2Al$$

$$1.5AlCl + TiCl_3 \rightarrow 1.5AlCl_3 + Ti$$

$$Ti + Al \rightarrow TiAl, \text{ or}$$

$$3Ti + Al \rightarrow Ti_3Al.$$

Although the reactions resulting in the co-deposition of titanium and aluminum on the substrate is a chemical vapor deposition reaction, it differs from more widely known chemical vapor deposition reactions. Typically, in chemical vapor deposition reactions, the substrate surface being coated is maintained at a temperature higher than that of the gases. In this case, however, the substrate temperature is maintained at a temperature which is lower than that of the temperature of the gases. This particular requirement results from the nature of the thermodynamic processes involved in the method of the invention.

Both titanium and aluminum are active metal species. They form volatile salts of great thermochemical stability. These compounds are most readily reduced by a reducing agent such as hydrogen to the elementary form.

Certain compounds of titanium and aluminum are readily deposited by conventional C.V.D. Typical of these are the carbides, nitrides or borides. These compounds all have high free energies of formation which tend to overcome the high free energies of the precursor titanium or aluminum compounds.

The titanium/aluminum compounds, on the other hand, because of the metallic nature of each of the elements, do not have high free energies. No good data are available but it is possible to estimate the free energies of titanium aluminides by comparison with data for similar compounds as available from the Handbook of Refractory Compounds, G.V., Sampsonov and I. M. Vinitsku, translated from Russian by Kenneth Shaw, I.F.I./Plenum, New York, 1980. A good estimate is believed to be about -10 kilocalories per mole at typical deposition temperatures. Such low free energies for the titanium aluminides are not sufficient to overcome the great stability of the precursor materials. In accordance with the method of the invention the temperature differential between the bed of titanium in the pot 53 and the substrate surface on the part 65 provides the driving force for deposition of the titanium aluminides. Moreover, the titanium in the pot 53 not only generates the $TiCl_3$ for the disproportionation reaction, but also serves to reduce the previously generated $AlCl_3$ to $AlCl$.

The advantage of the method of the invention is apparent when comparison is made to a process which would reflect a more classical CVD reaction.

$$TiCl_4 + 2H_2 \rightarrow Ti + 4HCl$$

$$AlCl_3 + 1.5 H_2 \rightarrow Al + 3HCl$$

$$Ti + Al \rightarrow TiAl$$

At 1100K., a desirable deposition temperature, the titanium deposit requires an input of about 54 kilocalories, and the aluminum deposit an input of about 53 kilocalories. On the other hand, the titanium aluminide formation provides about 10 kilocalories. Clearly the thermochemical balance is unfavorable for the formation of titanium aluminide from a mixture of $HCl_3$, $TiCl_4$, and $H_2$ at reasonable temperatures.

By comparison, by the method of the invention deposition of one gram atom of aluminum by disproportionation of aluminum monochloride at 1100K. gives up about 12 kilocalories; deposition of one gram atom of titanium provides 23 kilocalories, both added to the approximate 10 kilocalories from the formation of TiAl. There is thus provided a very favorable thermochemical balance for deposition.

In accordance with a further feature of the invention, a specific composition of titanium aluminide may be achieved. For example, the composition of $Ti_xAl$ can range from X=3 to X=1. This is done by varying the amount of hydrogen chloride added to the bed 55 directly from the tube 21. The less the proportion of HCl in the gas stream entering the bed 55, the lower the proportion of titanium in the resulting compound.

Experiments have been run investigating the possibility for the deposition of titanium aluminides from the highest oxidation state chlorides. These are indicated as runs 1–3 in Table I. In these three cases,, the experimental set up was different from that shown in the Figure in that the aluminum chloride generator and titanium chloride generator were run in parallel and injected directly into the deposition furnace where they were mixed with the hydrogen stream.

These experiments proved unsuccessful. Only very thin deposits, ca. one or two microns, were experienced in run times of approximately one hour. Specimen thicknesses were too small to make measurements of composition. This slow deposition rate is quite unsatisfactory from a practical production standpoint.

In running the process in accordance with the invention, as described above and shown in runs 4–8 in Table I, much higher deposition rates were immediately experienced. Success was achieved in the deposition of titanium aluminides of various compositions at very acceptable deposition rates as shown in runs 4–8. In all runs following the first three, substrate temperature Was maintained at 900° C. Compositions were achieved varying from those having titanium concentrations in excess of the $Ti_3Al$ composition to those having aluminum concentrations in excess of the TiAl composition. The analyses Were conducted by EDX microprobe. A summary of the runs is shown on Table I.

TABLE I

| Run No. | Part Dep. Temperature °C. | Thickness $\mu$ | Composition |
|---|---|---|---|
| 1 | 1000 | 12 | unknown |
| 2 | 1000 | 63 (not coherent) | unknown |
| 3 | 1200 | 15 | unknown |
| 4 | 900 | 300 | Al 29.14 At. % Ti 70.86 At. % |
| 5 | ·900 | 500 | Al 15.94 At. % Ti 84.06 At. % |
| 6 | 900 | 580 | Al 39.55 At. % Ti 60.45 At. % |
| 7 | 900 | 660 | Al 28.28 At. % Ti 71.72 At. % |
| 8 | 900 | 635 | Al 38.87 At. % Ti 61.13 At. % |

The following examples further illustrate the practice of the invention as shown in runs 4–8 of Table I, but are not intended to limit the scope of the invention in any respect.

EXAMPLE 1 (Run No. 4)

900 cc of HCl was passed over a bed of about 0.5 kg of Al in a 1 in. diameter vessel having a perforated graphite bottom, and an elastomeric closure at the top through which the HCl passed, at a temperature of 500° C. maintained by the clamshell heater. The gaseous mixture of 600 cc of Hcl and 1000 cc of hydrogen was passed directly into the 3 in. I.D. and 3.5 in. O.D. quartz chamber which contained approximately 0.5 kg of titanium. The temperature of the titanium was maintained at approximately 1100° C. and the graphite part being coated was maintained at 895°–900° C. The time of the deposition was 130 minutes. The X-ray diffraction measurement of the sample for this example was $Ti_3Al$. Electron microprobe analysis revealed Al of 29.14 At. % and Ti of 70.86 At. % which is calculated to be $Ti_{1.6}Al$. The thickness of the coating on the qraphite was approximately 0.020 in.

EXAMPLE 2 (Run No. 5)

Example 1 was repeated except that the amount of HCl directed into the quartz chamber was increased from 600 cc to 1000 cc. The resulting deposit was 15.94 At. % Al and 84.06 At. % Ti which is calculated to be $Ti_3Al$.

EXAMPLE 3 (Run No. 6)

Example 1 was repeated except that in place of 600 cc of HCl, no HCl was run over the titanium bed. The result was a deposit of aluminum 39.55 At. % and Ti 60.45 At. % which calculates to $TiAl_{1.2}$.

EXAMPLE 4 (Run No. 7)

Example 1 was repeated except that 300 cc of HCl in place of 600 cc HCl was passed into the quartz chamber over the titanium chips; the result, 28.28 At. % Al and 71.72 At. % Ti which calculates to be $Ti_{1.4}Al$.

EXAMPLE 5 (Run No. 8)

In place of the 600 cc HCl. 100 cc HCl Was passed into the quartz chamber; the result. 38.87 At. % Al and 61.13 At. % Ti which calculates to be $TiAl_{1.1}$.

All examples above were run at 20–30 torr, to assure volatility of the $TiCl_3$. The titanium and aluminum were both commercial grade. The HCl was high purity. The hydrogen was first passed through a platinum catalyst and a molecular sieve.

In addition to producing coatings essentially of titanium and aluminum, other alloying elements may be added, utilizing standard chemical vapor deposition techniques.

The microstructure of the titanium aluminide of the invention is characteristic of CVD deposits in that it exhibits a columnar crystal habit with elongated grains. Typical grain dimensions are between about $50\mu$ and $90\mu$ in the elongated dimension, and between about $10\mu$ and $30\mu$ in the transverse direction.

It may be seen, therefore, that the deposition of a variety of titanium aluminides is readily achieved in accordance with the invention. At the limits of the range, $Ti_3Al$ composition is achieved as well as TiAl composition and intermediate compositions of interest. Coherent deposits may be made at relatively high deposition rates which readily adhere to substrates. The deposition rate is controllable and may be selected in accordance with known CVD techniques to provide good "throwing power" for the uniform infiltration of graphite cloth or at a high rate for the practical buildup of massive deposits on surfaces. The rate can be adjusted by changing the temperature difference between the source and the part. Greater temperature difference providing higher rate and lower temperature difference providing lower rate. For most applications a temperature difference of at least about 150° C. is preferable.

Various modifications of the invention will become apparent to those skilled in the art from the foregoing discussion and accompanying drawing. Such modifications are intended to fall within the scope of the appended claims.

What is claimed is:

1. In a method for producing a titanium aluminide coating on a substrate surface, the improvement for varying the atomic ratio of titanium to aluminum in said coating which comprises:
   (a) supporting the substrate with the surface to be coated in a reactor chamber,
   (b) providing a flow of hydrogen and gaseous aluminum monochloride and a flow of gaseous titanium trichloride at gas temperatures of between about 800° C. and about 1200° C. over the surface of the substrate, by passing a flow of gaseous aluminum trichloride over a titanium surface at a temperature sufficient to cause the gases to react to produce said flow of gaseous titanium trichloride and aluminum monochloride,
   (c) providing from no flow to an appreciable flow of hydrogen chloride coincident with the flow of aluminum trichloride in step (b), wherein the flow rate of hydrogen chloride is controlled to provide the atomic ratio between the titanium and aluminum in said coating between about one and three, and
   (d) maintaining the substrate surface at a temperature below the temperature of said gases sufficient to cause disproportionation of said gases to deposit titanium and aluminum on said substrate surface.

2. A method according to claim 1 wherein the substrate surface is maintained at a temperature of at least about 150° C. below that of said gases.

3. A method according to claim 1 wherein the titanium surface is comprised of a bed of particulate titanium.

4. A method according to claim 1 wherein the gaseous aluminum trichloride is provided by passing a flow of hydrogen chloride over an aluminum surface at a temperature sufficient to cause a reaction but below the melting point of aluminum to produce the gaseous aluminum trichloride.

5. A method according to claim 4 wherein the aluminum surface is provided by a bed of particulate aluminum.

6. A method according to claim 1 wherein the temperature of the gaseous aluminum chloride and titanium trichloride is about 1100° C. and wherein the substrate surface temperature is about 900° C.

* * * * *